United States Patent
Younsi et al.

(10) Patent No.: US 8,217,644 B2
(45) Date of Patent: Jul. 10, 2012

(54) HIGH SENSITIVITY DIFFERENTIAL CURRENT TRANSFORMER FOR INSULATION HEALTH MONITORING

(75) Inventors: Karim Younsi, Ballston lake, NY (US); Prabhakar Neti, Niskayuna, NY (US); Manoj Ramprasad Shah, Latham, NY (US); Yingneng Zhou, Niskayuna, NY (US); Charles David Whitefield, II, Carson City, NV (US)

(73) Assignee: General Electric Company, Niskayuna, NY (US)

( * ) Notice: Subject to any disclaimer, the term of this patent is extended or adjusted under 35 U.S.C. 154(b) by 448 days.

(21) Appl. No.: 12/499,819

(22) Filed: Jul. 9, 2009

(65) Prior Publication Data

US 2011/0006802 A1    Jan. 13, 2011

(51) Int. Cl.
 *G01R 15/18* (2006.01)
(52) U.S. Cl. ........................................ 324/127; 324/126
(58) Field of Classification Search .......................... None
See application file for complete search history.

(56) References Cited

U.S. PATENT DOCUMENTS

| | | | |
|---|---|---|---|
| 3,879,639 A | 4/1975 | Sircom | |
| 4,001,646 A | 1/1977 | Howell | |
| 4,021,729 A * | 5/1977 | Hudson, Jr. | 324/509 |
| 4,128,804 A | 12/1978 | Russell | |
| 4,654,806 A * | 3/1987 | Poyser et al. | 700/292 |
| 6,169,489 B1 | 1/2001 | Kliman et al. | |
| 6,400,130 B2 * | 6/2002 | Berkcan et al. | 324/127 |
| 7,042,229 B2 | 5/2006 | Lee et al. | |

OTHER PUBLICATIONS

Sang Bin Lee, Karim Younsi, and Gerald B. Kliman; "An Online Technique for Monitoring the Insulation Condition of AC Machine Stator Windings"; IEEE Transactions on Energy Conversion, vol. 20, No. 4, Dec. 2005; 9pages.
Karim Younsi et al; "Current Transformer and Electrical Monitoring System"; Filed Dec. 17, 2008; U.S. Appl. No. 12/336,653; 24Pages.

* cited by examiner

*Primary Examiner* — Minh N Tang
(74) *Attorney, Agent, or Firm* — Jason K. Klindtworth

(57) ABSTRACT

A current transformer is provided. The current transformer includes a magnetic core having a central opening, at least one pair of conductors extending through the central opening and positioned symmetrically with respect to a center point of the magnetic core, one or more coils disposed on the magnetic core along a magnetic neutral axis of the magnetic core and one or more coils disposed on the magnetic core along a reference axis, wherein the reference axis is substantially perpendicular to the magnetic neutral axis.

19 Claims, 7 Drawing Sheets

US 8,217,644 B2

HIGH SENSITIVITY DIFFERENTIAL CURRENT TRANSFORMER FOR INSULATION HEALTH MONITORING

BACKGROUND

Embodiments of the present invention relate generally to current transformers, and more particularly to a high sensitivity differential current transformer for insulation health monitoring.

Current transformers are devices used to scale large primary currents to smaller, easy to measure, secondary currents. Generally, in the current transformers, the ratio of the windings determines the relation between input and output currents. Furthermore, current transformers of various shapes and sizes may be used as interfacing solutions between high currents and instrumentation devices.

Moreover, current transformers are also extensively used for measuring current and monitoring the operation of a power grid. By way of example, a differential current transformer may be used for measurement of leakage current in an insulation monitoring system. Also, as will be appreciated, there are various types of faults that may develop in industrial motors during operation. A majority of these faults in large motors may be related to stator-winding insulation. It is therefore desirable to monitor the condition of stator insulation in order to safeguard these motors. Currently, offline tests are available to determine the health of stator insulation in a motor. Unfortunately, these tests require an outage of the motor from service. For example, partial discharge analysis is one technique that may be used to measure online or offline the insulation corona discharge activity on large motor windings. Differential current transformers have been used to protect a motor from catastrophic damage only after a failure has already occurred. However, these techniques fail to facilitate assessment of the health of stator insulation while the motor is operational.

It is therefore desirable to develop a monitoring system that is capable of assessing the health of stator insulation while the motor is operational. More particularly, it is desirable to develop a monitoring system that facilitates online assessment of the health of stator insulation.

BRIEF DESCRIPTION

Briefly in accordance with one aspect of the present technique a current transformer is provided. The current transformer comprises a magnetic core having a central opening, at least one pair of conductors extending through the central opening and positioned symmetrically with respect to a center point of the magnetic core, and at least one coil disposed on the magnetic core in a balanced configuration relative to a magnetic neutral axis of the magnetic core.

In accordance with another aspect of the present technique a current transformer is provided. The current transformer comprises a magnetic core having a central opening, at least one pair of conductors extending through the central opening and positioned symmetrically with respect to a center point of the magnetic core, one or more coils disposed on the magnetic core along a magnetic neutral axis of the magnetic core and one or more coils disposed on the magnetic core along a reference axis, wherein the reference axis is substantially perpendicular to the magnetic neutral axis.

In accordance with yet another aspect of the present technique an electrical monitoring system is provided. The electrical monitoring system comprises a current transformer comprising a magnetic core having a central opening, at least one pair of conductors extending through the central opening and positioned symmetrically with respect to a center point of the magnetic core and at least one coil disposed on the magnetic core in a balanced configuration relative to a magnetic neutral axis of the magnetic core. The electrical monitoring system further comprises a data acquisition module for measuring current signals from the output of the current transformer.

DRAWINGS

These and other features, aspects, and advantages of the present invention will become better understood when the following detailed description is read with reference to the accompanying drawings in which like characters represent like parts throughout the drawings, wherein.

Figure 4:
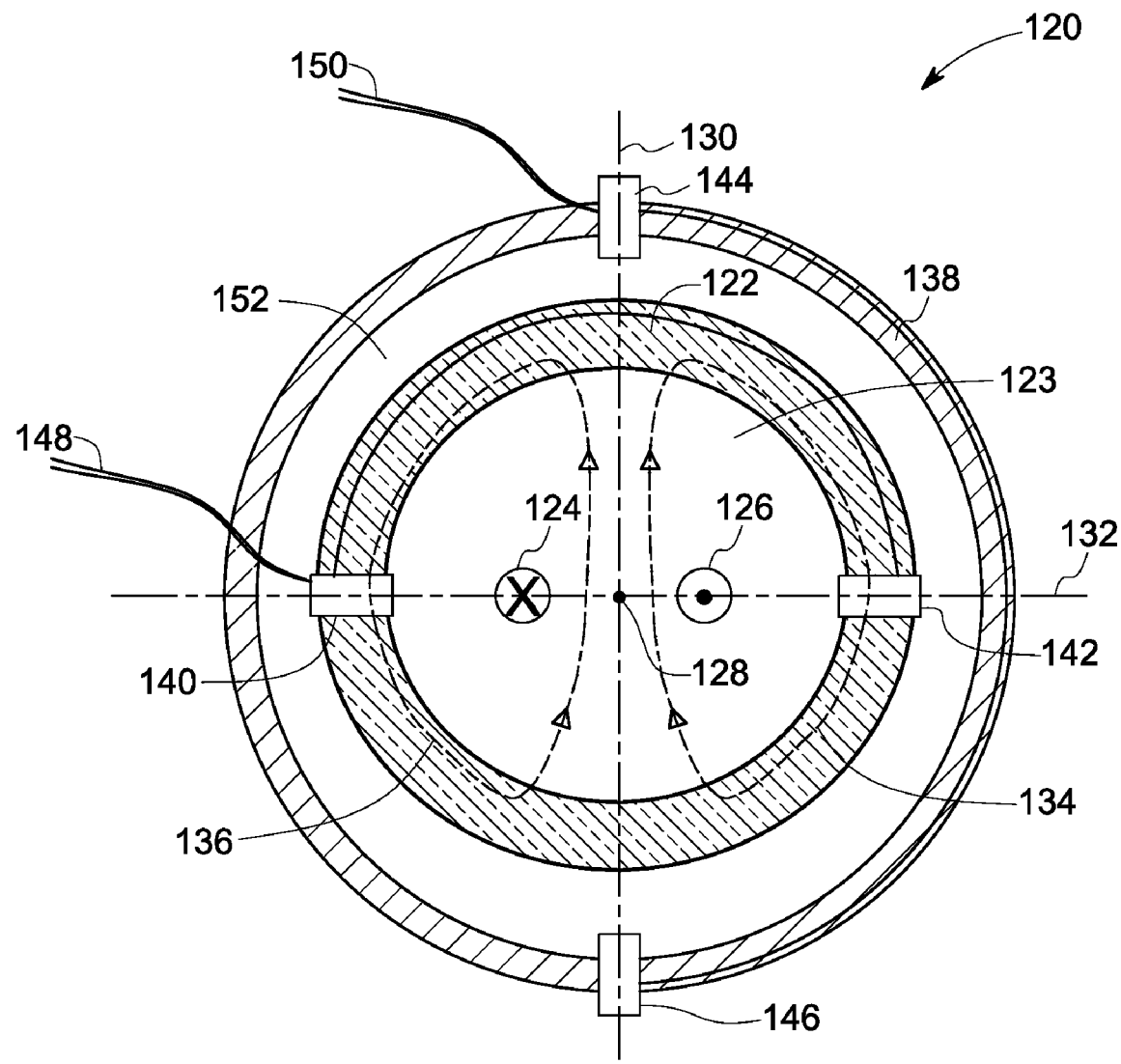
FIG. 4 is a diagrammatic illustration of an exemplary dual core current transformer, in accordance with aspects of the present technique.
Figure 5:
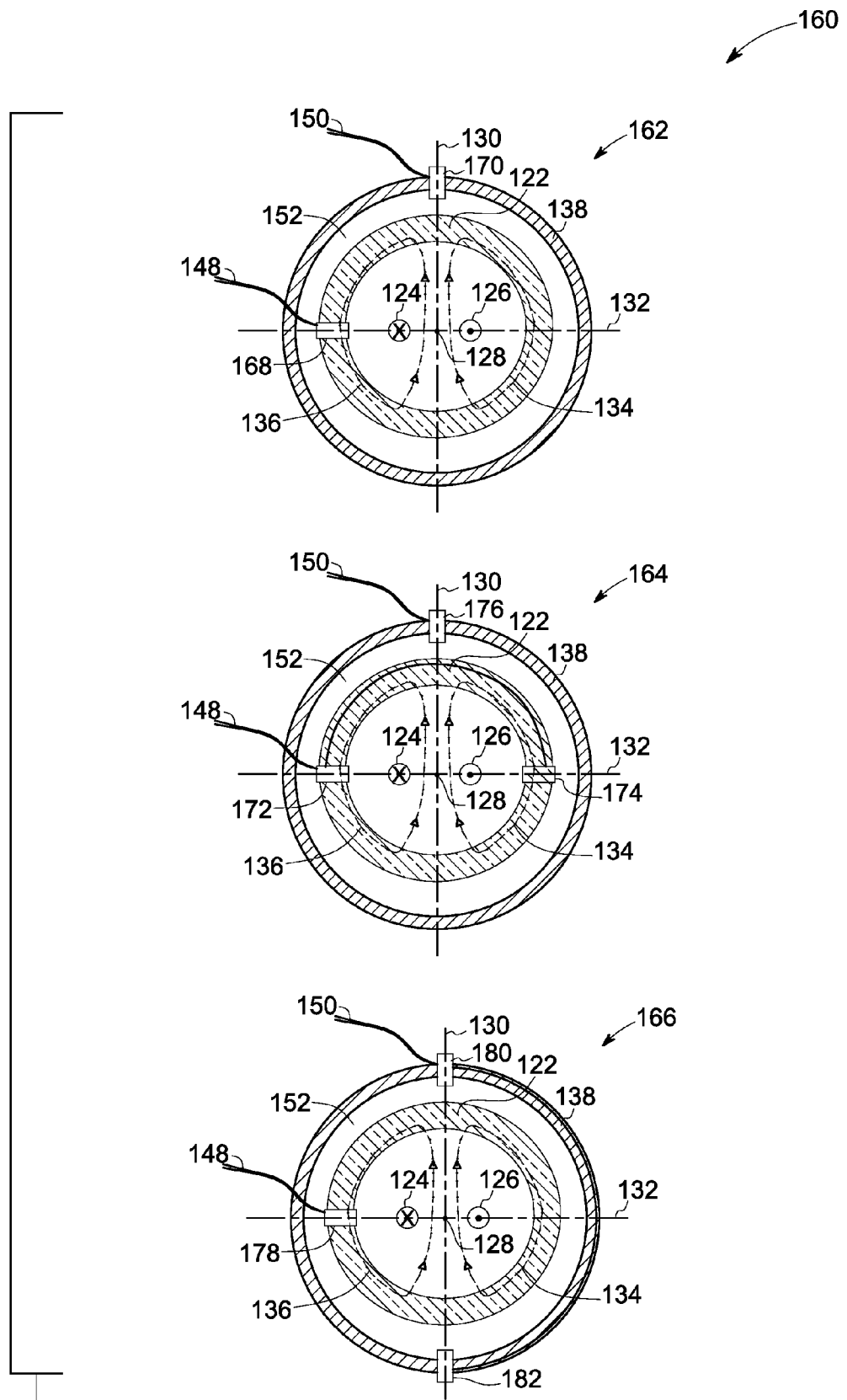
FIG. 5 is a diagrammatic illustration of other embodiments of an exemplary dual core transformer, in accordance with aspects of the present technique.
Figure 6:
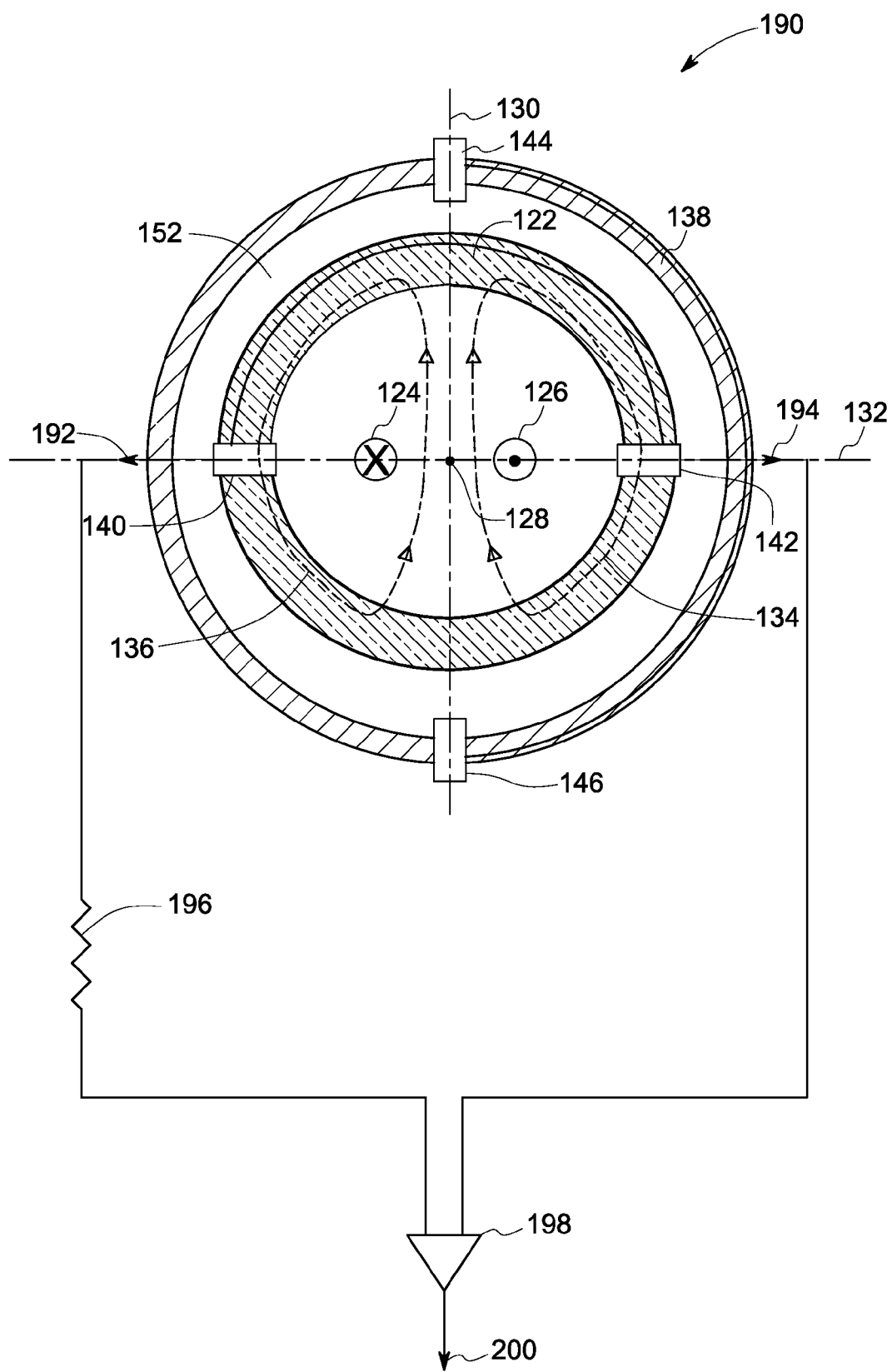
Figure 7:
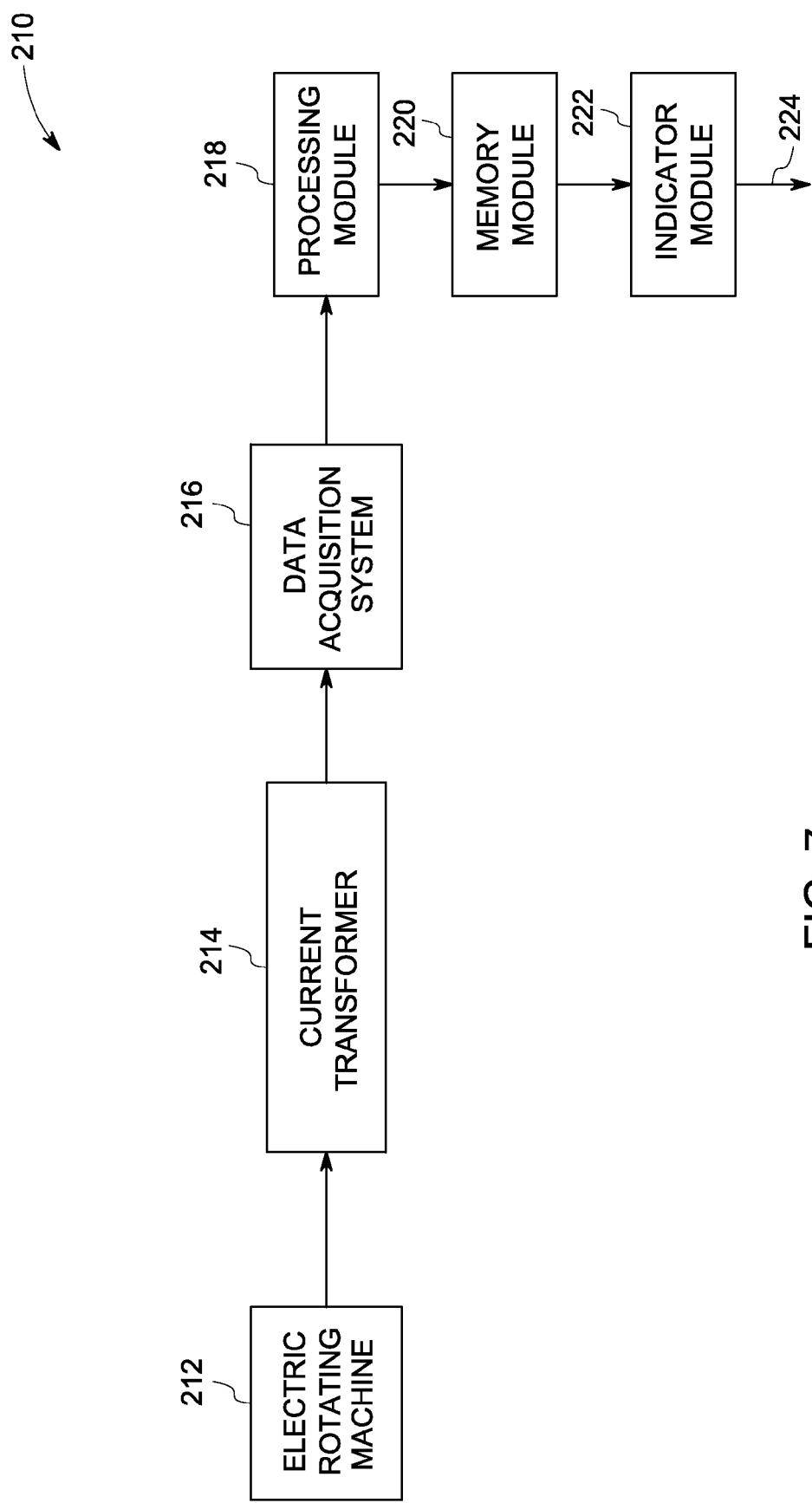

FIG. 6 is a diagrammatic illustration of a partial discharge detection system for partial discharge detection on power frequency (PF) motors and pulse width modulation (PWM) motors, in accordance with aspects of the present technique; and FIG. 7 is a block diagram illustrating an electrical monitoring system employing the exemplary current transformers of FIGS. 1-6, in accordance with aspects of the present technique.

DETAILED DESCRIPTION

Embodiments of the present invention relate generally to current transformers and more particularly to high sensitivity differential current transformers for insulation health monitoring. Although the embodiments of the present invention will be discussed with reference to current transformers, it may be noted that the embodiments may be applicable to transformers in general. Furthermore, though the present discussion provides examples in context of large motors employing current transformers, the present techniques may be employed for applications such as, but not limited to, motors, generators, cables, Xformers, Geographical Information Systems, accelerators and photovoltaic panels.

As will be appreciated, a current transformer comprises a core, a primary winding that includes a plurality of conductors extending through a closed central opening of the core and a secondary winding comprising a plurality of turns wrapped on the core. Current is directed along the conductors in opposite directions and thus opposite magnetic fluxes along the central axis are generated. The current that is generated on the plurality of winding turns is induced by a difference of the opposite magnetic fluxes and is generally indicative of a difference of the currents carried in the conductors. This current may be referred to as a "differential current." Also, these current transformers may also be known as "differential current transformers."

Figure 1:
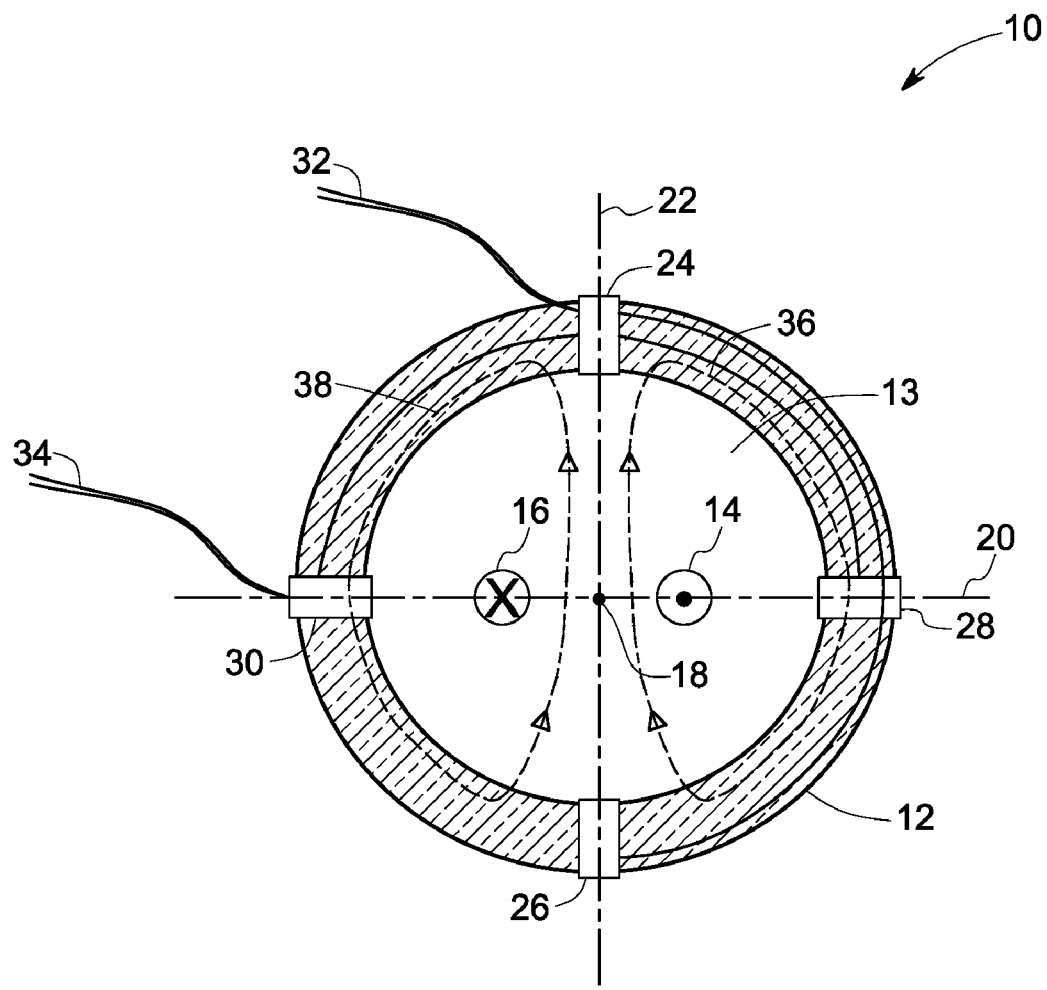
FIG. 1 is a diagrammatic illustration of an exemplary current transformer, in accordance with aspects of the present technique.

Referring to FIG. 1, a diagrammatic illustration of an exemplary current transformer 10, in accordance with aspects of the present technique is presented. The current transformer 10 includes a magnetic core 12 defining a central opening 13. Also, as depicted in FIG. 1, the current transformer 10 may include at least one pair of conductors 14, 16 extending through the central opening 13 of the magnetic core 12. These conductors 14, 16 may carry substantially similar currents in opposite directions. As previously noted, the at least one pair of conductors are also primary windings of the current transformer 10.

Reference numeral 14 may be representative of a first conductor, while reference numeral 16 may be representative of a second conductor. The first conductor 14 and the second conductor 16 may be configured to carry substantially similar currents in opposite directions. More particularly, the first conductor 14 may carry a first current in a first direction, while the second conductor 16 may carry a second current in a second direction, where the second current is substantially similar to the first current, and where the second direction is substantially opposite to the first direction. By way of example, the first conductor 14 is shown as carrying a current in a direction into the page, while the second conductor 16 is illustrated as carrying a second current that is substantially similar to the first current and is in a direction that is opposite to the first direction. In other words, the second conductor 16 is shown as carrying the second current in the second direction that is out of the page for example. The first conductor 14 may generate a magnetic flux 36 and the second conductor 16 may generate an opposite magnetic flux 38. The poles of magnetic flux patterns thus formed determine a magnetic neutral axis 22. It may be noted that the magnetic neutral axis 22 is substantially perpendicular to a reference axis 20.

Furthermore, the first conductor 14 and the second conductor 16 may be positioned symmetrically with respect to a center point 18 of the magnetic core 12. More particularly, the first conductor 14 and the second conductor 16 may be positioned along the reference axis 20 passing through the center point 18 of the magnetic core 12. In one embodiment, the reference axis 20 may be a diameter of the magnetic core 12. Also, the magnetic neutral axis 22 is substantially perpendicular to the first and the second conductors 14, 16 as the magnetic neutral axis is substantially perpendicular to the reference axis 20.

Additionally, the exemplary current transformer 10 may also include at least one coil disposed on the magnetic core 12. In the embodiment illustrated in FIG. 1, the magnetic core 12 is shown as including a first coil 24, a second coil 26, a third coil 28 and a fourth coil 30 disposed on the magnetic core 12. In accordance with aspects of the present technique, the coils include a plurality of windings (not shown in FIG. 1) wound around the magnetic core 12. The corresponding magnetic fluxes 36, 38 generated by the first conductor 14 and the second conductor 16 may induce a current in the coils 24, 26, 28, 30. As previously noted, these coils 24, 26, 28, 30 may each include a plurality of turns. Also, these coils 24, 26, 28, 30 may constitute the secondary winding of the current transformer 10. Also, in the presently contemplated configuration, the first coil 24 may be operationally coupled to the second coil 26, while the third coil 28 may be operationally coupled to the fourth coil 30. The coils 24, 26 may be connected to a first terminal 32 and coils 28, 30 may be connected to a second terminal 34 for electrical coupling to a reading apparatus where a reading is measured as a "differential current." As used herein, the differential current is the net difference between the current carried by the first conductor 14 and the second conductor 16.

The coils 24, 26, 28, 30 may include sense coils. The sense coils may include leakage sense coils as well as a partial discharge and load current sense coils. More particularly, if the sense coils are positioned along the magnetic neutral axis 22, the sense coils may be configured as leakage sense coils. Alternatively, if the sense coils are positioned perpendicular to the magnetic neutral axis 22 or along the reference axis 20, the sense coils may be configured as partial discharge or load current sense coils. In other words, in accordance with exemplary aspects of the present technique, coils positioned along the magnetic neutral axis detect leakage current whereas the coils positioned along the reference axis detect partial discharge as well as load currents. In accordance with aspects of the present technique, if the coils are positioned along the magnetic neutral axis 22 and the current carried by the first and the second conductors 14, 16 are substantially similar the residual signal is zero. This zero residual signal is representative of absence of any insulation leakage current. However, if there exists a net difference between the current carried by the first conductor 14 and the second conductor 16 the sense coils detect a residual signal which is representative of an existence of an insulation leakage current. It may also be noted that the residual signal generated as an output from the sense coils is a function of number of turns in the sense coils, a burden resistor, core size, permeability of material of the core and so forth.

In certain embodiments, current transformers such as the exemplary current transformer 10 may include one or more locking mechanisms (not shown) for securing conductors and/or coils in a balanced configuration. As used herein, balanced configuration means that the conductors or the power cables are placed within the central opening 13 of the current transformer parallel to the axis of the current transformer and symmetrical with respect to the one or more coils. Thus the magnetic flux produced by the conductors is setup symmetrically inside the magnetic core of the current transformer. In certain embodiments, a locking mechanism for the one or more coils may include a permanent mechanism such as adhesives or banding. In other embodiments, locking mechanisms for one or more coils may include a removable mechanism, such as, but not limited to, brackets or clamps. In some embodiments, locking mechanisms for conductors may include centering devices such as, plates or blocks with centering holes. Such plates and/or blocks may be internal or external to the magnetic core 12.

In accordance with aspects of the present technique, the magnetic core 12 may include a material such as, but not limited to, silicon steel, alloys, ferrites, and so forth. Furthermore, the magnetic core 12 may be circular in shape. In other embodiments, the magnetic core 12 may be a triangle, a square, a rectangle or a polygon. In accordance with further aspects of the present technique, the magnetic core 12 may include a uniform solid core. Alternatively, the magnetic core 12 may be a split core. The exemplary current transformer 10 may be used to facilitate online monitoring of health of a stator winding insulation in a motor and will be described in greater detail with respect to FIG. 7.

Figure 2:
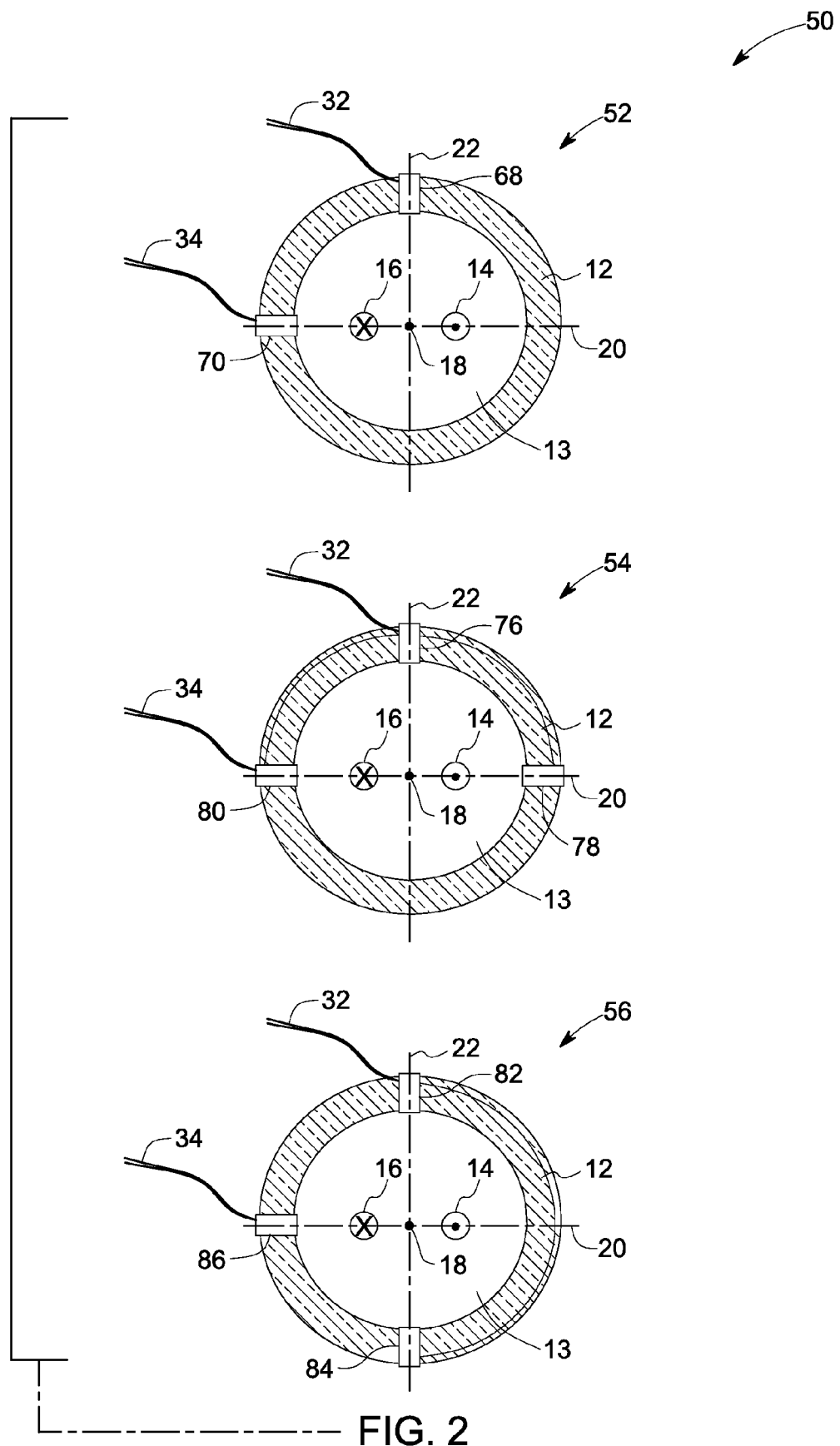
FIG. 2 is a diagrammatic illustration of other embodiments of an exemplary current transformer, in accordance with aspects of the present technique.

FIG. 2 is a diagrammatic illustration 50 of alternative embodiments of an exemplary current transformer, such as the current transformer 10 (see FIG. 1) in accordance with aspects of the present technique. Reference numeral 12 may be representative of a magnetic core. As previously noted, the magnetic core 12 may include a material, such as, but not limited to, silicon steel, alloys, ferrites, and so forth. Furthermore, the magnetic core 12 may be circular in shape. In other embodiments, the magnetic core 12 may be a triangle, a square, a rectangle or a polygon. In accordance with further aspects of the present technique, the magnetic core 12 may include a uniform solid core, or a split core. Reference numeral 20 is representative of a reference axis passing through a center point 18 of the magnetic core 12, wherein the reference axis 20 is substantially perpendicular to a magnetic neutral axis 22. The magnetic core 12 may include a pair of conductors 14, 16 carrying substantially similar currents in opposite directions. The pair of conductors 14, 16 may be positioned along the reference axis 20 at symmetrical positions with respect to the center point 18.

As previously noted, the magnetic core 12 may also include one or more coils. Reference numeral 52 may be representative of an embodiment of a current transformer wherein the magnetic core 12 includes a pair of coils 68, 70. These coils 68, 70 may include sense coils. As previously noted, coils positioned along the magnetic neutral axis detect leakage current whereas the coils positioned along the reference axis detect partial discharge as well as load currents. Accordingly, the sense coils may be generally configured to measure a differential current due to differences in current between the first conductor 60 and the second conductor 62. In one embodiment, the pair of sense coils 68, 70 may be positioned on the magnetic core 12 at a complementary position with respect to one another. More particularly, a first coil 68 may be positioned along the magnetic neutral axis 22. A second coil 70 may be positioned on the magnetic core 12 such that the second coil 70 is at a position along the reference axis 20 that is perpendicular to the magnetic neutral axis 22. More particularly, the second coil 70 may be positioned on the magnetic core 12 at an angle of 90 degrees with respect to the first coil 68.

The first coil 68 may be used to detect leakage current in the current transformer 52. Also, the second coil 70 may be used for detecting partial discharge and load current in the current transformer 52. Alternatively, the first coil 69 may be used for detecting a partial discharge and load current in a current transformer 52, while the second coil 70 may be used for detecting leakage current in the current transformer 52. The first coil 68 may be connected to a first terminal 32 and the second coil 70 may be connected to a second terminal 34 to measure a reading due to leakage current and/or partial discharge and load current.

Moreover, reference numeral 54 may be representative of another embodiment of arrangement of coils in the current transformer 54. In the present embodiment, the magnetic core 12 may include three coils 76, 78, 80. The coils 76, 78, 80 may be positioned on the magnetic core 12 in a manner such that the coils may be able to detect leakage current as well as partial discharge and load currents. As previously noted, coils positioned along the magnetic neutral axis 22 detect leakage current whereas the coils positioned along the reference axis 20 detect partial discharge as well as load currents. In one embodiment, a first coil 76 may be positioned along the magnetic neutral axis 22. A second coil 78 and a third coil 80 may be positioned on the magnetic core 12 in a manner such that the second coil 78 and the third coil 80 are positioned along a reference axis 20 that is perpendicular to the magnetic neutral axis 22. Alternatively, the second coil 78 and the third coil 80 may be positioned on the magnetic core 12 in a manner such that the second coil 78 and the third coil 80 are placed at a complementary position with respect to the first coil 76. More particularly, the second coil 78 and the third coil 80 may be respectively positioned at an angle of about 90 degrees and about 270 degrees with respect to the first coil 76.

Furthermore, the first coil 76 disposed along the magnetic neutral axis 22 may be used for detecting leakage current in the current transformer 54. In the present embodiment, the second coil 78 and the third coil 80 disposed along the reference axis 20 may be used for detecting partial discharge and load currents in the current transformer 54.

With continuing reference to FIG. 2, another embodiment 56 of a current transformer is illustrated. In the present embodiment, the magnetic core 12 is depicted as including a plurality of coils 82, 84, 86. As previously noted, with respect to other embodiments of FIG. 2, the pair of conductors 14, 16 pass through a closed central opening 13 of the magnetic core 12. The pair of conductors 14, 16 carry substantially similar currents in opposite directions. In the present embodiment 56, three coils 82, 84, 86 may be disposed on the magnetic core 12 of the current transformer. A first coil 82 and a second coil 84 may be positioned along the magnetic neutral axis 22. In addition, a third coil 86 may be placed on the magnetic core 12 along the reference axis 20 that is perpendicular to the magnetic neutral axis 22. More particularly, the third coil 86 may be placed on the magnetic core 12 at a position that is complementary with respect to the first coil 82 and the second coil 84. Furthermore, the first coil 82 and the second coil 84 may be used to detect leakage current. The third coil 86 disposed along the reference axis 20 may be used to detect partial discharge and load currents.

In accordance with exemplary aspects of the present technique, the exemplary current transformers of FIGS. 1-2 may be utilized to monitor health of stator insulation in a motor while the motor is operational. The current transformer acts as a sensor that is capable of online monitoring of insulation health of a motor. As used herein, the term "online" is used to refer to a state of the motor while it is operating. This online monitoring of the health of stator insulation may be performed by online measurement of capacitance (C) and dissipation factor (DF) of insulation between stator phase windings and ground wall insulation of motors. It may be noted that the load current of the motor may influence online measurement of C and DF in large motors.

Therefore, in accordance with the aspects of the present technique the design of exemplary current transformers described with reference to FIG. 1 and FIG. 2 may be utilized to measure a small differential current between the first conductor and the second conductor with a plurality of sense coils positioned along the magnetic neutral axis of the exemplary current transformers. Hence, to measure system capacitive current and resistive currents associated with stator winding insulation that flow through the ground wall insulation, it is desirable to position the pair of conductors in a balanced position with respect to the center point 18 (see FIG. 1) of the magnetic core 12 (see FIG. 1). Additionally, the one or more coils are positioned on the magnetic core 12 along the magnetic neutral axis 20 of the current transformer 10 (see FIG. 1) to facilitate measurement of any leakage current.

In one embodiment, the current transformers of FIGS. 1-2 may include a silicon steel tape wound current transformer. The exemplary current transformer may be used for measuring a capacitive leakage current. It may further be noted that the design of current transformers may be modified to measure the capacitive leakage current with a desired sensitivity. In another embodiment, an exemplary current transformer may be formed by designing the magnetic core as a stamp and stack core. In one embodiment, the silicon steel laminations may be stamped in the shape of a core. Additionally, the one or more coils may be placed along the magnetic neutral axis. The coils may be formed from a number of turns that form a winding. It may be noted that higher the number of turns in a winding that form a coil, the higher is the voltage signal obtained for a given amount of leakage current through the current transformer. In yet another embodiment, the magnetic core of the exemplary current transformer may include one or more sheets of magnetic material. Non-oriented grained steel may be utilized to construct the magnetic core. Alternatively, in one embodiment the magnetic core may include a Supermalloy that is, a magnetic material composed of nickel, molybdenum and iron with high magnetic permeability.

In accordance with aspects of the techniques discussed above, the gain of the current transformer 10 increases in comparison to the signal-to-noise ratio (SNR) because the magnetic field created by the current carrying conductors influences the measurement of leakage current. This measurement may be dependent on a variety of factors, such as, but not limited to, idealities present in the centering devices, the coils, and conductors as well as in the magnetic properties of the core.

Figure 3:
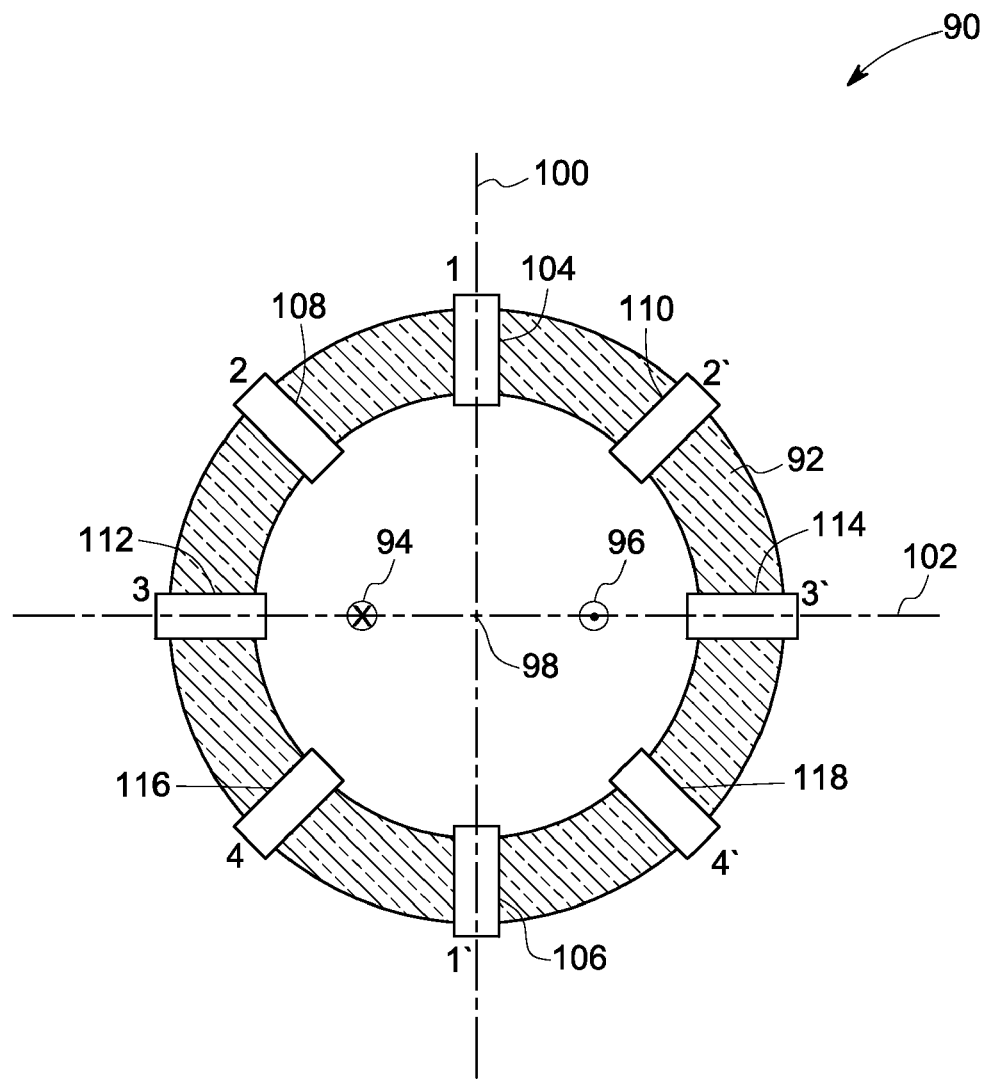
FIG. 3 is a diagrammatic illustration of placement of coils in the exemplary current transformer of FIG. 1, in accordance with aspects of the present technique.

FIG. 3 is a diagrammatic illustration 90 of the placement of coils on a magnetic core of a current transformer, in accordance with aspects of the present technique. Reference numeral 92 is representative of a magnetic core. A first conductor 94 and a second conductor 96 are placed in symmetric positions with respect to a center point 98 of the magnetic core 92 along a reference axis 102. The current carried in the first conductor 94 and the second conductor 96 generate respective magnetic fluxes that may be used to identify a magnetic neutral axis 100. A plurality of coils may be placed on the magnetic core 92 as depicted. The arrangement of the coils on the magnetic core 92 may be achieved by positioning coils 104, 106 at position 1-1' that is, along the magnetic neutral axis 100. In another embodiment, coils 108, 110 may be placed at positions 2-2'. In yet another embodiment, coils 112, 114 may be placed at positions 3-3' on the magnetic core 92. In another embodiment, coils 116, 118 may be placed at positions 4-4' on the magnetic core 92.

Referring now to FIG. 4, a current transformer 120 having a dual core in accordance with aspects of the present technique, is illustrated. The current transformer 120 includes an inner magnetic core 122. The inner magnetic core 122 defines a central opening 123 through which a pair of conductors 124, 126 extend or pass through. The pair of conductors 124, 126 are positioned symmetrically with respect to a center point 128 of the inner magnetic core 122. More particularly, the pair of conductors 124, 126 may be positioned on a reference axis 132 that may be a diameter of the inner magnetic core 122, for example. The pair of conductors 124, 126 carry substantially similar currents in opposite directions. In one embodiment, the first conductor 124 carries a first current in a first direction, while the second conductor carries a second current in a second direction. It may be noted that the first current and the second current are substantially equal in magnitude. In one embodiment, the first conductor 124 may carry a current in a direction that is into the page and the second conductor 126 may carry a current in an opposite directions that is in a direction out of the page, for example.

In accordance with exemplary aspects of the present technique, the current transformer 120 may also include an outer core 138 circumscribing the inner magnetic core 122. In accordance with aspects of the present technique, the outer core 138 may be a sense core.

Furthermore, in accordance with exemplary aspects of the present technique, one or more coils may be disposed on the inner magnetic core 122, the outer sense core 138, or both. In a presently contemplated configuration, the inner magnetic core 122 may include one or more coils disposed along a magnetic neutral axis 130 that is formed as a result of opposite magnetic fluxes due to similar but opposite currents carried by the pair of conductors 124, 126. The pair of conductors carrying current generate respective magnetic fluxes 134, 136. These magnetic flux patterns 134, 136 form poles on the magnetic core. These poles facilitate determination of the magnetic neutral axis 130. Alternatively, the one or more coils may be disposed on the inner magnetic core 122 along the reference axis 132 that is perpendicular to the magnetic neutral axis 130. In other embodiments, the one or more coils may be placed symmetrically with respect to the magnetic neutral axis 130. In accordance with aspects of the present technique, the one or more coils may include a leakage sense coil to detect leakage current, or a partial discharge and load current sense coil to detect partial discharge and load currents. The outer sense core 138 includes one or more coils 144, 146 placed in a balanced configuration relative to a magnetic neutral axis 130. In a presently contemplated configuration, the coils 144, 146 may include sense coils.

In accordance with aspects of the present technique, the inner magnetic core 122 may include materials, such as, but not limited to, a silicon steel, ferro alloys, ferrites, or combinations thereof. The outer sense core 138 may include materials such as, but not limited to, ferrites, silicon steel, and so forth. In one embodiment, the inner magnetic core 122 and the outer sense core 138 may include materials having different permeabilities. Furthermore, the outer sense core 138 may be a uniform solid core or a split core. The inner magnetic core 122 may be a dipole core. In addition, the inner magnetic core 122 may be configured as an internal magnetic shield thereby providing a shield to the dipole field created by the pair of conductors 124, 126 carrying currents in opposite directions.

As previously noted, the plurality of coils may be disposed on the outer sense core 138 along the magnetic neutral axis 130. In another embodiment, the plurality of coils may be disposed on the outer sense core 138 at a position complementary to the magnetic neutral axis 130. More particularly the plurality of coils may be disposed along the reference axis 132. As previously noted, the plurality of coils may be formed from a plurality of windings. In accordance with aspects of the present technique the plurality of coils are connected to a reading meter (not shown in FIG. 4) to measure the differential leakage current in the current transformer with greater sensitivity. In a presently contemplated configuration, coils 144, 146 may be connected in series to a terminal 150 to measure the leakage current, also, the coils 140, 142 disposed on the inner magnetic core 122 may be connected in series to measure partial discharge as well as load currents via a terminal 148. Reference numeral 152 is representative of an air gap between the inner magnetic core 122 and the outer sense core 138. The exemplary current transformer 120 with dual core may be utilized to monitor capacitance (C) and dissipation factor (DF) in large motors.

In accordance with aspects of the present technique, other embodiments of the exemplary current transformer 120 of FIG. 4 are presented in FIG. 5. Turning now to FIG. 5, a diagrammatic illustration 160 of other embodiments 162, 164, 166 of an exemplary dual core current transformer such as the dual core current transformer 120 (see FIG. 4) are presented. Reference numeral 162 is representative of a first alternative embodiment of the exemplary dual core current transformer. The current transformer 162 has a first coil 168 placed along the reference axis 132 on the inner magnetic core 122. A second coil 170 may be disposed on the outer sense core 138 along the magnetic neutral axis 130. The second coil 170 may include a sense coil. In the present embodiment 162, the first coil 168 may be configured to detect partial discharge and load current, while the second coil 170 may be configured to detect leakage current in the exemplary current transformer 162.

Reference numeral 164 represents another embodiment of the dual core transformer, in accordance with aspects of the present technique. The current transformer 164 includes a sense coil 176 disposed on the outer sense core 138 along the magnetic neutral axis 130 for detecting leakage current. Furthermore, a pair of coils 172, 174 are disposed along the reference axis 132 that is perpendicular to the magnetic neutral axis 130. The first coil 172 and the second coil 174 may be connected in series and may be configured to detect partial discharge and load currents.

Another embodiment 166 of the dual core current transformer has a plurality of sense coils 180, 182 disposed on the outer sense core 138 along the magnetic neutral axis 130. A coil 178 is disposed on the inner magnetic core 122 along the reference axis 132 to measure a partial discharge and load current. It may further be noted that the coils on the inner magnetic core 122 and the outer sense core 138 may be placed in a balanced configuration with respect to the magnetic neutral axis 130.

Although, the illustrated embodiments of FIG. 4-5 are shown as including two coils disposed on the inner magnetic core 122 and the outer sense core 138, it may be noted that any number of coils may be placed on the inner magnetic core 122 and/or the outer sense core 138 is dependent on applications for which the dual core current transformer is used.

The exemplary current transformers of FIGS. 4-5 may be utilized to monitor health of stator insulation in a motor. The current transformer acts as a sensor that is capable of online monitoring of insulation of a motor. This online monitoring of the health of stator insulation may be performed by online measurement of capacitance (C) and dissipation factor (DF) of insulation between stator phase windings and ground wall insulation of motors. The dual core current transformer may also be configured to enhance the signal-to-noise ratio (SNR) by use of an internal shield. This internal shield reduces influence of power cables or conductor currents on measurements of leakage current. In the exemplary dual core current transformer it has been observed that the magnetic flux due to power cable currents or conductor currents is present in the inner magnetic core of the dual core current transformer core and the magnitude of the magnetic flux is minimum on the magnetic neutral axis. Furthermore, the magnetic field due to the power cable current is confined to the internal shielding core or the inner magnetic core and does not extend to the outer core. Thus, a small differential current can be measured with much more accuracy.

By way of example, a tape wound Supermalloy dual core current transformer was tested with an internal shield, such as an inner magnetic core. The current transformer showed linearity with respect to the leakage current when a burden resistor was varied from 1 ohm to 2 kilo-ohm. Also, the sensitivity of gain to the burden resistor depicted that the dual core current transformer has the highest gain of 3.537 mV/mA and the highest SNR of 232.25. Table I shows the design performance of various single core and dual core current transformers and Table II shows the specifications of the single core and dual core current transformers. As used herein:

USS: Unshielded Stamp and Stack silicon steel current transformer (single core current transformer)
UTW: Unshielded Tape Wound silicon steel current transformer (single core current transformer)
USM: Unshielded Supermalloy tape wound current transformer (single core current transformer)
SSM: Shielded (with silicon steel taped inner magnetic core) Supermalloy tape wound current transformer (Dual core current transformer)

TABLE I

Current Transformer Design performance

| | USS | UTW | USM | SSM |
|---|---|---|---|---|
| Gain (mV/mA) | 0.763 | 2.86 | 3.445 | 3.537 |
| Reduction in Noise (%) | 99.63 | 98.65 | 92.31 | 99.09 |
| SNR Before Centering [@ 100 mA Leakage] | 0.042 | 0.439 | 1.99 | 2.11 |
| SNR After Centering [@ 100 mA Leakage] | 11.63 | 32.45 | 25.87 | 232.25 |

TABLE II

Current Transformer specifications

| | |
|---|---|
| No. of Turns | 2 × 250 = 500 |
| Power cable current | 400 Arms |
| Burden Resistor | 2000 Ohm |

As illustrated in Table I and Table II, a gain of 0.763 mV/mA was observed for the unshielded stamp and stack steel current transformer. Also, a reduction in noise of 99.63% was observed. The centering of conductors in accordance with aspects of present technique, resulted in enhanced SNR that is, from 0.042 to 11.63. For an unshielded tape wound silicon steel current transformer, a gain of 2.86 mV/mA and a reduction in noise of 98.65% was observed. An increase in SNR from 0.439 to 32.45 was observed when the conductors were centered. Similarly, for an unshielded Supermalloy tape wound current transformer a gain of 3.445 mV/mA and a reduction in noise of 92.31% was observed, furthermore, the SNR increased from 1.99 to 25.87 when the conductors were centered. A shielded or dual core Supermalloy tape wound current transformer with a silicon steel taped inner magnetic core a gain of 3.537 mV/mA and a reduction in noise of 99.09% was observed. The SNR increased from 2.11 to 232.25 after centering the conductors.

Referring now to FIG. 6, a partial discharge detection system 190 for detecting a partial discharge in a motor is presented. The partial discharge detection system 190 may be used for motors, such as, but not limited to power frequency (PF) motors and pulse width modulation (PWM) motors. The partial discharge detection system 190 may include an exemplary dual core current transformer, such as the dual core current transformer 120 (see FIG. 4). As previously noted with reference to FIG. 4, the dual core current transformer includes the inner magnetic core 122 and the outer sense core 138. In addition, the dual core current transformer also includes conductors 124, 126 carrying substantially similar currents in opposite directions relative to one another. Moreover, the first and the second conductor 124, 126 are positioned within the central opening 123 of the inner magnetic core 122 in a balanced configuration with respect to the center point 128 along the reference axis 132. Also, the first coil 140 and the second coil 142 are disposed on the inner magnetic core 122 along the reference axis 132. The outer sense core 138 includes sense coils 144 and 146 to detect leakage current from the current transformer. The first coil 140 and the second coil 142 are connected in series. A signal 192 from the first coil 140 and a signal 194 from the second coil 142 may be added by employing an adder 198 to algebraically add a voltage induced in the first coil 140 and the second coil 142 and thereby represent a total signal of interest. In accordance with aspects of the present technique, at low frequencies that may be below about 25 MHz, the signal 192 may be subtracted from the signal 194 is substantially equal to zero. Alternatively, for higher frequencies that may be above about 25 MHz, a signal pulse from the signal 192 may be delayed via use of a delay line 196 so that the net signal 200 output from the adder 198 is not null. The signal 192 is delayed by a predetermined time which may be in the range from about 0.5 nano-seconds to about 10 micro-seconds via use of the delay line 196 to facilitate a time shifted or delayed arrival of signal 192 and signal 194 at the adder 198 input. The output signal 200 does not contain power frequency (PF) or switching noise but only partial discharge because of delay of signal 192. This arrangement may therefore be used to detect partial discharge pulses. The present arrangement may be employed for applications such as, but not limited to, Variable Speed Drive (VSD) motors.

Referring now to FIG. 7, a block diagram of an electrical monitoring system 210 including the exemplary current transformer described hereinabove is presented. The electrical monitoring system 210 may be configured to monitor health of a stator winding insulation in an electrical machine. The electrical monitoring system may include an electrical rotating machine 212. It may be desirable to monitor the health of insulation in stator windings. More particularly, it may be desirable to facilitate online monitoring of the electrical rotating machine 212 while the electrical rotating machine 212 is operational. Accordingly, an exemplary current transformer 214 may be used to facilitate online monitoring of the health of the insulation on the stator winding of the electrical rotating machine 212. In one embodiment, the current transformer 214 may include the exemplary single core current transformer illustrated in FIGS. 1-2. In certain other embodiments, the current transformer 214 may include the dual core current transformers illustrated in FIGS. 4-5. As previously described, the single core and the dual core current transformer are configured to monitor online the health of insulation in the stator windings of the electrical rotating machine 212 by detecting any leakage current in the conductors. More particularly, if there is no leakage current, a residual signal from the current transformer 214 will be zero. However, if there exists a net difference between the current carried by the conductors then the one or more sense coils will generate a residual signal representative of leakage current. This residual signal may be indicative of a defect in the insulation of stator windings in the electrical rotating machine 212.

The electrical monitoring system 210 may also include a data acquisition module 216 that enables measurement of signals from an output of the current transformer 214. The signals from the data acquisition module 216 may be communicated to a processing module 218. The processing module 218 may include a range of circuitry, such as a microprocessor based module, and application-specific or general purpose computer, a programmable logic controller, or even a logical module or code within such a device. A memory module 220 may be used for storing the output generated from the processing module 218. The same, or a different memory module may also store programming code, as well as parameters and values required for the calculations made by the processing module 218.

Furthermore, the electrical monitoring system 210 may also include an indicator module 222 to compare the output of the processing module 218 with a threshold value and generate an indication signal 224 based on the comparison. In general, the indication signal 224 may provide a simple status output, or may be used to activate or set a flag, such as an alert when the output of the processing module 218 exceeds the threshold value, indicating that the insulation is in need of attention or will be in need of attention based upon its current state or a trend in its state.

The exemplary single core and dual core current transformers as described hereinabove have variety of applications such as motors, harmonic generators, turbine generators, wind generators, cables, Xformers, GIS, accelerators and photovoltaic panels. Furthermore, the exemplary single core and dual core current transformers have several advantages, such as, but not limited to, a lower sensitivity to cable location in the central opening of the current transformer, a higher gain and ease of installation, balancing and calibration. Additionally, the online method described hereinabove may enable an enhanced assessment of the health of stator winding insulation and estimate of the remaining life of stator winding insulation in an electrical rotating machine and may be tied to smart-grid applications for monitoring and diagnostics of various electrical equipments.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system, comprising:
a current transformer comprising:
  a magnetic core having a central opening;
  at least one pair of conductors extending through the central opening and positioned symmetrically with respect to a center point of the magnetic core;
  one or more coils disposed on the magnetic core along a magnetic neutral axis of the magnetic core; and
  one or more coils disposed on the magnetic core along a reference axis, wherein the reference axis is substantially perpendicular to the magnetic neutral axis; and
a data acquisition module for measuring current signals from the output of the current transformer,
wherein the current transformer is configured for online measurement of capacitance and dissipation factor of insulation between stator phase windings and ground wall insulation of motors.

2. The system of claim 1, wherein the one or more coils disposed on the magnetic core along the magnetic neutral axis are configured as leakage sense coils.

3. The system of claim 1, wherein the one or more coils disposed on the magnetic core along the reference axis are configured as partial discharge and load current sense coils.

4. The system of claim 1, wherein the magnetic core comprises silicon steel, alloys, ferrites, or combinations thereof.

5. The system of claim 1, wherein the magnetic core comprises a circular core.

6. The system of claim 1, wherein the magnetic core comprises a polygonal core.

7. The system of claim 1, wherein the magnetic core comprises a solid core or a split core.

8. The system of claim 1, wherein the at least one pair of conductors comprise a first conductor and a second conductor, wherein the first conductor carries a first current in a first direction, and the second conductor carries a second current in a second direction that is substantially opposite to the first direction, and wherein the second current is substantially equal in magnitude to the first current.

9. An electrical monitoring system, comprising:
a current transformer, comprising:
- a magnetic core having a central opening;
- at least one pair of conductors extending through the central opening and positioned symmetrically with respect to a center point of the magnetic core; and
- at least one coil disposed on the magnetic core in a balanced configuration relative to a magnetic neutral axis of the magnetic core; and a data acquisition module for measuring current signals from the output of the current transformer,
wherein the current transformer is configured for online measurement of capacitance and dissipation factor of insulation between stator phase windings and ground wall insulation of motors.

10. The electrical monitoring system of claim 9, further comprising a processing module for detecting current signals and monitoring current on the at least one pair of conductors.

11. The electrical monitoring system of claim 10, further comprising a memory module for storing an output generated from the processing module.

12. The electrical monitoring system of claim 10, further comprising an indicator module for comparing the output of the processing module to a predetermined threshold value and generating an indication signal based on the comparison of the output of the processing module to the predetermined threshold value.

13. The electrical monitoring system of claim 9, wherein the at least one pair of conductors comprise a first conductor and a second conductor, wherein the first conductor carries a first current in a first direction, and the second conductor carries a second current in a second direction that is substantially opposite to the first direction, and wherein the second current is substantially equal in magnitude to the first current.

14. The electrical monitoring system of claim 9, wherein the at least one coil disposed on the magnetic core comprises a sense coil.

15. The electrical monitoring system of claim 14, wherein the sense coil comprises leakage sense coil or partial discharge and load current sense coil.

16. A system comprising:
a current transformer comprising
- a magnetic core having a central opening;
- at least one pair of conductors extending through the central opening and positioned symmetrically with respect to a center point of the magnetic core; and
- at least two coils disposed on the magnetic core in a balanced configuration relative to a magnetic neutral axis of the magnetic core; and a data acquisition module for measuring current signals from the output of the current transformer,
wherein the current transformer is configured for online measurement of capacitance and dissipation factor of insulation between stator phase windings and ground wall insulation of motors.

17. The system of claim 16, further comprising a processing module for detecting current signals and monitoring current on the at least one pair of conductors.

18. The system of claim 17, further comprising a memory module for storing an output generated from the processing module.

19. The system of claim 17, further comprising an indicator module for comparing the output of the processing module to a predetermined threshold value and generating an indication signal based on the comparison of the output of the processing module to the predetermined threshold value.

* * * * *